(12) United States Patent
Sung et al.

(10) Patent No.: US 12,500,105 B2
(45) Date of Patent: Dec. 16, 2025

(54) TRANSPORT VEHICLE FOR TRANSPORTING ARTICLE IN MANUFACTURING FACTORY AND ARTICLE TRANSPORT SYSTEM INCLUDING THE SAME

(71) Applicant: SEMES CO., LTD., Cheonan-si (KR)

(72) Inventors: Hyuk Jae Sung, Cheonan-si (KR); Ki Tae Noh, Seongnam-si (KR); Ju Ho Lee, Hwaseong-si (KR); Jung Hyun Lim, Suwon-si (KR)

(73) Assignee: SEMES CO., LTD., Cheonan-si (KR)

( * ) Notice: Subject to any disclaimer, the term of this patent is extended or adjusted under 35 U.S.C. 154(b) by 328 days.

(21) Appl. No.: 18/117,617

(22) Filed: Mar. 6, 2023

(65) Prior Publication Data
US 2024/0006213 A1      Jan. 4, 2024

(30) Foreign Application Priority Data
Jun. 30, 2022 (KR) ................ 10-2022-0080920

(51) Int. Cl.
*H01L 21/677* (2006.01)
*B66C 11/00* (2006.01)
(Continued)

(52) U.S. Cl.
CPC ........ *H01L 21/67724* (2013.01); *B66C 11/00* (2013.01); *B66C 19/00* (2013.01);
(Continued)

(58) Field of Classification Search
CPC ......... H01L 21/67724; H01L 21/67733; H01L 21/6773; H01L 21/677; H01L 21/67259; H01L 21/68; B66C 11/00; B66C 11/06; B66C 19/00; B66C 13/46; B66C 15/04; B66C 15/045; B65G 1/0457; B65G 1/04; B65G 1/00; B65G 35/00; B65G 47/60; B65G 2203/042; B65G 43/00;
(Continued)

(56) References Cited

U.S. PATENT DOCUMENTS

| 5,511,487 A * | 4/1996 | Sakagami | B61B 3/02 |
| | | | 104/295 |
| 6,443,400 B2 * | 9/2002 | Murata | B61L 23/005 |
| | | | 246/1 C |

(Continued)

FOREIGN PATENT DOCUMENTS

| CN | 201737610 U | * | 2/2011 |
| CN | 204737639 U | * | 11/2015 |

(Continued)

OTHER PUBLICATIONS

Office Action from the Korean Intellectual Property Office dated Jan. 10, 2024.
Office Action from the Japan Patent Office dated Jan. 30, 2024.

*Primary Examiner* — Anna M Momper
*Assistant Examiner* — Henrix Soto

(57) ABSTRACT

A transport vehicle for transporting an article in a manufacturing factory includes a driving unit which drives along a driving rail, and a hoist unit which is located under the driving unit and supports the article. The hoist unit includes a frame, and a pair of tail plates which is provided on a rear surface of the frame and protrudes rearward.

17 Claims, 7 Drawing Sheets

(51) Int. Cl.
  *B66C 19/00*   (2006.01)
  *H01L 21/67*   (2006.01)
(52) U.S. Cl.
  CPC .... *H01L 21/67259* (2013.01); *H01L 21/6773* (2013.01); *H01L 21/67733* (2013.01)
(58) Field of Classification Search
  CPC .......... B65G 69/001; B65G 2201/0297; B65G 2201/02; B61B 3/00; F16F 15/08; F16F 15/085; F16F 15/04; B61L 23/041
  USPC ....................................................... 212/328
  See application file for complete search history.

(56) References Cited

U.S. PATENT DOCUMENTS

| | | | |
|---|---|---|---|
| 9,758,308 B1 * | 9/2017 | Nishikawa | H01L 21/67715 |
| 10,597,264 B1 * | 3/2020 | Muck | B66C 19/00 |
| 11,027,927 B2 * | 6/2021 | Shin | B65G 43/02 |
| 2012/0055367 A1 * | 3/2012 | Zayas | B61B 3/00 104/88.01 |
| 2015/0329334 A1 * | 11/2015 | Lee | B25J 11/0095 212/332 |
| 2017/0129747 A1 * | 5/2017 | Russell | B61B 3/02 |
| 2018/0099817 A1 * | 4/2018 | Murakami | B66C 15/045 |
| 2018/0118239 A1 * | 5/2018 | Murakami | B61L 5/206 |
| 2018/0297620 A1 * | 10/2018 | Murakami | B61B 10/02 |
| 2021/0213983 A1 | 7/2021 | Yamazaki | |
| 2021/0339993 A1 * | 11/2021 | Matsuda | B65G 1/0492 |

FOREIGN PATENT DOCUMENTS

| | | | | |
|---|---|---|---|---|
| CN | 106395636 A | * | 2/2017 | |
| CN | 109110361 A | * | 1/2019 | ........... B65G 1/0492 |
| CN | 110948503 A | * | 4/2020 | |
| CN | 211519443 U | * | 9/2020 | |
| CN | 112830175 | | 5/2021 | |
| CN | 112830175 A | * | 5/2021 | ............ B65G 35/00 |
| CN | 112918743 A | * | 6/2021 | |
| CN | 113597588 | | 11/2021 | |
| CN | 113860177 | | 12/2021 | |
| CN | 114121739 | | 3/2022 | |
| JP | H06202731 A | * | 7/1994 | |
| JP | 08-310385 | | 11/1996 | |
| JP | 2002019605 A | * | 1/2002 | |
| JP | 2010-067144 | | 3/2010 | |
| JP | 2013-075748 | | 4/2013 | |
| JP | 2016-174167 | | 9/2016 | |
| JP | 2018136844 A | * | 8/2018 | |
| JP | 2018190235 A | * | 11/2018 | |
| JP | 2019-093875 | | 6/2019 | |
| KR | 20030045512 A | * | 6/2003 | |
| KR | 10-2005-0067270 | | 7/2005 | |
| KR | 10-2021-0010040 | | 1/2021 | |
| KR | 10-2247042 | | 1/2021 | |
| KR | 10-2021-0091656 | | 7/2021 | |
| WO | 2007-058927 | | 5/2007 | |
| WO | 2020-090254 | | 5/2020 | |
| WO | WO-2021010013 A1 | * | 1/2021 | ............... B61B 3/02 |

* cited by examiner

TRANSPORT VEHICLE FOR TRANSPORTING ARTICLE IN MANUFACTURING FACTORY AND ARTICLE TRANSPORT SYSTEM INCLUDING THE SAME

CROSS-REFERENCE TO RELATED APPLICATION

This patent application claims priority to Korean Patent Application No. 10-2022-0080920, filed on Jun. 30, 2022, the entire contents of which are incorporated by reference herein for all purposes.

BACKGROUND

Field of the Invention

The present disclosure relates to a transport vehicle for transporting an article in a manufacturing factory and an article transport system including the transport vehicle.

Description of the Related Art

A semiconductor or display manufacturing process is a process of manufacturing a final product through tens to hundreds of processes on a substrate (a wafer or glass), and each of the processes may be performed by a manufacturing facility that performs the corresponding process. When a process of an article in a specific manufacturing facility is completed, the article (a substrate) may be transported to a next manufacturing facility to proceed with a next process, and may be stored in a storage facility for a predetermined period of time.

A logistics system of a manufacturing factory refers to a system that transports or stores an article for a manufacturing process as described above, and may be largely divided into a transport facility for transporting an article and a storage facility for storing an article. In the logistics system, an overhead hoist transport (OHT) system that drives along a rail installed on a ceiling is being applied to a manufacturing factory.

A transport vehicle which transports an article detects an object such as another transport vehicle or an obstacle located around the transport vehicle by various types of sensors installed on a body of the transport vehicle or a controller of an upper part thereof, and is preset to travel to a target position without colliding with the object. However, collision of the transport vehicle may occur due to the sensors which do not operate normally or due to an object which is not detected by the sensors. Particularly, the driving path of the transport vehicle in a manufacturing factory includes not only straight sections but also branching and curved sections. In the branching and curved sections, there is a high possibility that the transport vehicle collides with an object without detecting the object by the sensors. Particularly, when the transport vehicle collides with another transport vehicle, an article (e.g., a wafer and a mask) being transported may be damaged due to impact of the collision, and an electronic device (e.g., a sensor) provided in the transport vehicle may be damaged.

SUMMARY

Accordingly, the present disclosure has been made keeping in mind the above problems occurring in the related art, and the present disclosure is intended to propose a transport vehicle which can prevent the risk of collision of the transport vehicle and minimize damage to parts of the transport vehicle in the event of the collision, and an article transport system including the same.

In order to achieve the above objective, according to one aspect of the present disclosure, there is provided a transport vehicle for transporting an article in a manufacturing factory. The transport vehicle may include a driving unit which drives along a driving rail, and a hoist unit which is located under the driving unit and supports an article. The hoist unit may include a frame, and a pair of tail plates which is provided on a rear surface of the frame and protrudes rearward.

According to the embodiment of the present disclosure, each of the tail plates may be provided under a bumper unit provided on a rear of the frame.

According to the embodiment of the present disclosure, the tail plate may protrude rearward as much as an end of the bumper unit.

According to the embodiment of the present disclosure, a position of each of the tail plates may be determined such that the tail plate avoids colliding with a vehicle detection sensor provided on a center portion of a front surface of another transport vehicle during collision of the transport vehicle with another transport vehicle located behind the transport vehicle.

According to the embodiment of the present disclosure, the tail plate may be configured to reflect light emitted from the vehicle detection sensor.

According to an aspect of the present disclosure, a transport vehicle for transporting an article in the manufacturing factory includes a driving unit which drives along the driving rail, and a hoist unit which is located under the driving unit and supports an article. The hoist unit includes a frame, a bumper unit provided on each of front and rear surfaces of the frame, and a pair of tail plates which is provided on the rear surface of the frame and protrudes rearward.

According to an embodiment of the present disclosure, the bumper unit may include a front bumper unit provided on the front surface of the frame, and a rear bumper unit provided on the rear surface of the frame.

According to an embodiment of the present disclosure, the front bumper unit may include a front bracket which is coupled to a center portion of the front surface of the frame and has a shaft protruding forward, a front cover plate which is coupled to opposite side portions of the front surface of the frame and protrudes forward and bends, and a rubber bumper member coupled to an outer side of the front cover plate.

According to an embodiment of the present disclosure, the rear bumper unit may include a rear bracket which is coupled to a center portion of the rear surface of the frame and has a shaft protruding rearward, a rear cover plate which is coupled to opposite side portions of the rear surface of the frame and protrudes rearward and bends, and a damper member which is provided between the rear bracket and the rear cover plate and generates buffering force.

According to an aspect of the present disclosure, an article transport system of a manufacturing factory is provided. The Article transport system may include a transport vehicle which transports an article, and a driving rail which provides a driving path of the transport vehicle. The transport vehicle includes a driving unit which drives along the driving rail; and a hoist unit which is located under the driving unit and supports the article. The hoist unit includes a frame, a bumper unit provided on each of front and rear surfaces of the frame, and a pair of tail plates which is provided on the rear surface of the frame and protrudes rearward.

According to the present disclosure, a transport vehicle located at a front side has a pair of tail plates protruding rearward, and thus can be detected by a rear transport vehicle through the associated tail plates, and even during the collision of the front transport vehicle with the rear transport vehicle, damage to the vehicle detection sensor located on the front surface of the rear transport vehicle can be prevented.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
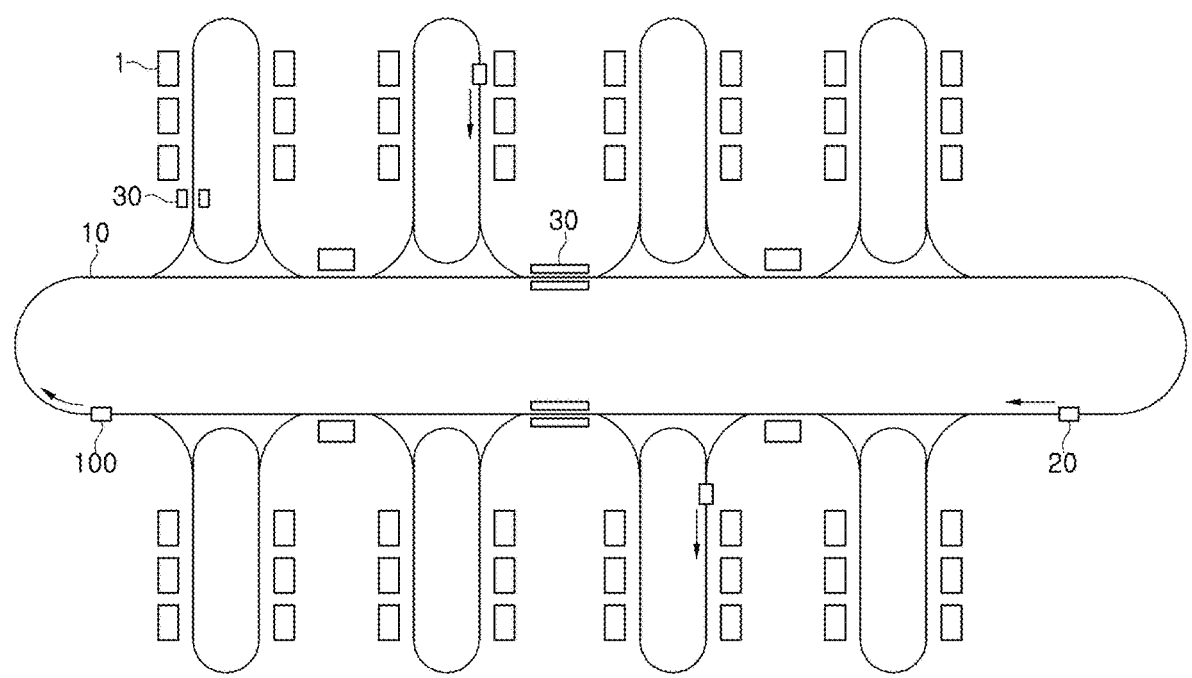
FIG. 1 illustrates a schematic layout of an article transport system for transporting an article in a manufacturing factory according to the present disclosure.

Hereinafter, an exemplary embodiment of the present invention will be described in detail with reference to the accompanying drawings so that those skilled in the art to which the present invention pertains can easily practice. The present invention can be implemented in many different forms and is not limited to the embodiment described herein.

In order to clearly describe the present invention, parts irrelevant to the description are omitted, and the same reference numerals are assigned to the same or similar elements throughout the specification.

In addition, in embodiments, components having the same configuration will be described with the same reference numerals, and in other embodiments, only configurations different from the representative embodiment will be described.

Throughout the specification, when a part is said to be "connected" to another part, this includes not only the case of being "directly connected", but also "indirectly connected" with other members interposed therebetween. Furthermore, when a part is said to "include" a certain component, this means that other components may be further included rather than excluding other components, unless otherwise stated.

Unless defined otherwise, all terms used herein, including technical or scientific terms, have the same meaning as commonly understood by a person skilled in the art to which the present invention pertains. Terms such as those defined in a commonly used dictionary should be interpreted as having meanings consistent with meanings in the context of related technologies, and should not be interpreted as ideal or excessively formal meanings unless explicitly defined in the present application.

FIG. 1 illustrates a schematic layout of an article transport system for transporting an article in a manufacturing factory according to the present disclosure. Hereinafter, as a manufacturing factory to which the present disclosure is applied, a semiconductor manufacturing factory that manufactures semiconductor products will be described as an example. However, the range of manufacturing factories to which the present disclosure can be applied is not limited to a specific type of a manufacturing factory and may be applied to manufacturing factories in various industries. For example, the article transport system of the present disclosure may be applied to other types of manufacturing plants that produce products such as display panels, electronic devices, automobiles, or secondary batteries.

The manufacturing factory consists of one or more clean rooms, and manufacturing facilities 1 for performing semiconductor manufacturing processes may be installed in each clean room. In general, by repeatedly performing a plurality of manufacturing processes on a substrate (e.g., a wafer), a finally processed substrate may be completed, and when the manufacturing process of a substrate is completed in a specific semiconductor manufacturing facility 1, the substrate is transported to a manufacturing facility 1 for the next manufacturing process. Here, the wafer may be transported while being stored in a transport container (e.g., a front opening unified pod, FOUP) that can accommodate a plurality of substrates. The transport container in which wafers are stored may be transported by a transport vehicle 20. The transport vehicle 20 may be referred to as an overhead hoist transport (OHT) that travels along a driving rail 10 installed on a ceiling.

Referring to FIG. 1, in the manufacturing factory, the manufacturing facilities 1 for performing processes are installed and the transport vehicle 20 which transports an article between the manufacturing facilities 1 and the driving rail 10 which provides a driving path of the transport vehicle 20 are provided. Here, when the transport vehicle 20 transports an article between the manufacturing facilities 1, the article may be transported from a specific manufacturing facility 1 directly to another manufacturing facility 1, or after the article is stored in a stocker facility 30, the article may be transported to the another manufacturing facility.

Figure 2:
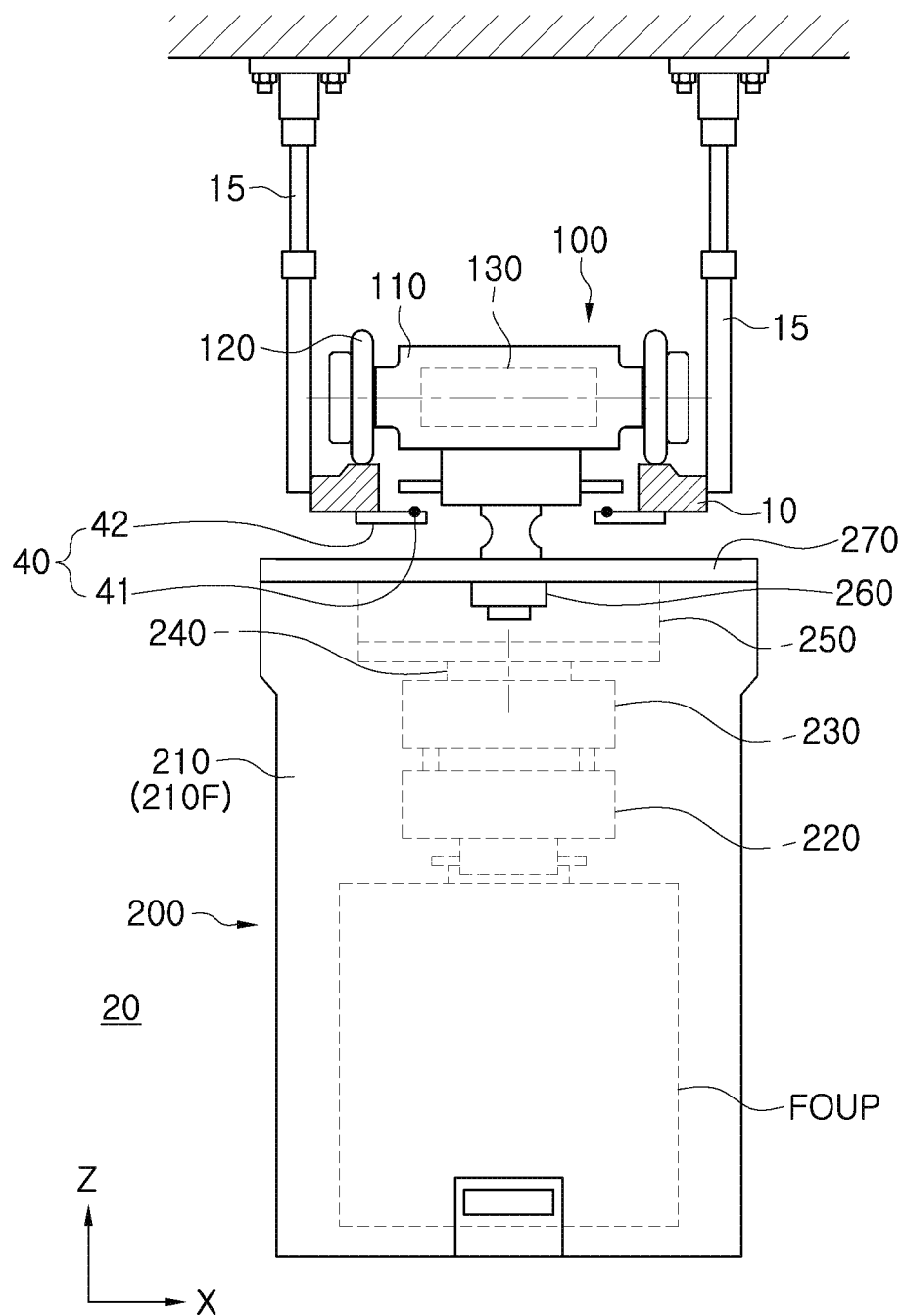
FIG. 2 illustrates a transport vehicle according to the present disclosure viewed from a side in front of the transport vehicle.
Figure 3:
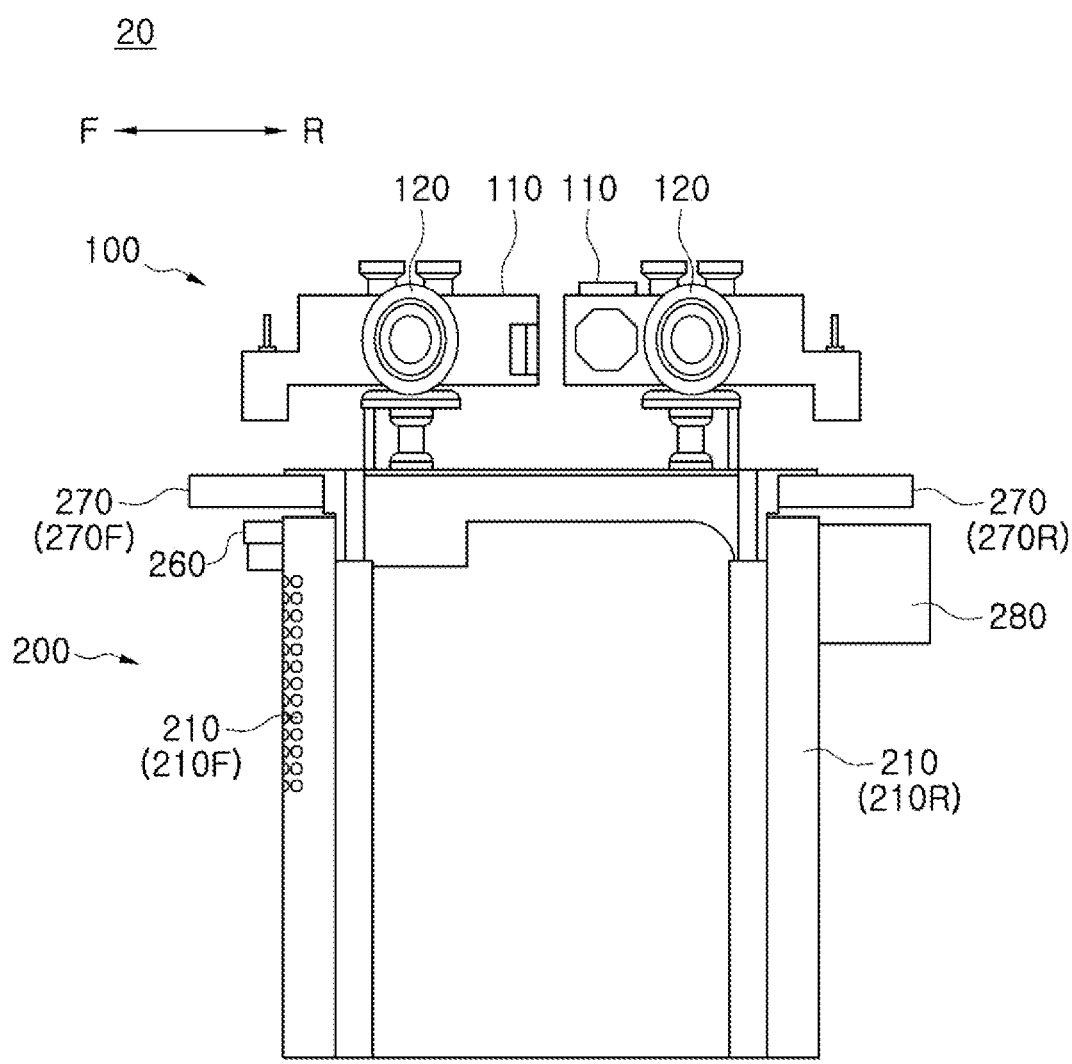
FIG. 3 illustrates the transport vehicle viewed from a side thereof.

FIGS. 2 and 3 illustrate the transport vehicle 20 for transporting an article in a manufacturing factory according to the present disclosure. FIG. 2 illustrates a transport vehicle according to the present disclosure viewed from a side in front of the transport vehicle, and FIG. 3 illustrates the transport vehicle viewed from a side thereof.

Referring to FIG. 2, the driving rail 10 includes a pair of rail members spaced apart from each other in a horizontal direction and paired with each other, and is installed on the ceiling side of the manufacturing factory by rail supports 15. The lower end parts of the rail supports 15 support the pair of rail members, respectively, and the upper end parts thereof may be mounted to the ceiling of the manufacturing factory. Each of the pair of rail members may be formed to provide a driving surface on an upper side thereof.

As illustrated in FIG. 2, a power supply apparatus 40 for supplying power to the transport vehicle 20 includes a cable installation structure 42 installed under the driving rail 10, and a power supply cable 41 installed in the cable installation structure 42. The power supply cable 41 induces a current into a power receiving device of the transport vehicle 20 which provides driving power.

Referring to FIG. 2, the transport vehicle 20 includes a driving unit 100 which drives along the driving rail 10, and a hoist unit 200 which is located under the driving unit 100 and supports an article. The hoist unit 200 moves together with the driving unit 100 and transports an article to the manufacturing facility 1 and loads the article therein.

The driving unit 100 includes a body 110 and driving wheels 120. An axle extending left and right is mounted to the body 110. The axle may include a plurality of axles, and the axles may be spaced apart from each other in a front-to-rear direction. The driving wheels 120 are wheels that provide mobility to the body 110 so that the body 110 can drive according to the guidance of the driving rail 10. The driving wheels 120 may be mounted respectively to the opposite ends of the axle and may be respectively in contact with the upper surfaces of one pair of driving rails 10 such that the driving wheels 120 can rotate. The driving unit 100 further includes a wheel drive unit 130 which provides power to rotate the driving wheels 120. For example, the wheel drive unit 130 may be configured to rotate the axle.

The hoist unit 200 includes a frame 210. The frame 210 is located under the driving rail 10 and is connected to the driving unit 100. The upper part of the frame 210 may be connected to the lower part of the body 110 by one connector or a plurality of connectors. The frame 210 provides receiving space in which an article is received. The frame 210 is formed to have a structure in which left and right sides, and a lower side are open so that the article can be moved in a horizontal direction (in an X direction) and a downward direction in the receiving space.

Furthermore, the hoist unit 200 further includes a handle unit 220 for gripping or releasing an article, and a handle movement unit which moves the handle unit 220 between a first position and a second position. The first position is a position at which an article gripped by the handle unit 220 is received in the receiving space of the frame 210, and the second position is a position outside the frame 210 corresponding to a position out of the first position. The hoist unit 200 includes a vertical drive unit 230, a rotation drive unit 240, and a horizontal drive unit 250 as the handle movement unit.

The handle unit 220 may include a handle that grips and releases an article, and a handle support that supports the handle. The vertical drive unit 230 moves the handle unit 220 up and down. The vertical drive unit 230 may move the handle unit 220 in a vertical direction (a Z direction) by winding or unwinding at least one belt on a drum. The rotation drive unit 240 rotates the handle unit 220 around a vertical axis, and the horizontal drive unit 250 moves the handle unit 220 in a horizontal direction. For example, an article gripped by the handle unit 220 may be vertically moved, rotated around the vertical axis, and moved horizontally in such a manner that the handle unit 220 is vertically moved by the vertical drive unit 230, the vertical drive unit 230 is rotated around the vertical axis by the rotation drive unit 240, and the rotation drive unit 240 is moved horizontally by the horizontal drive unit 250.

The hoist unit 200 includes a vehicle detection sensor 260 located on a front surface 210F of the frame 210. The vehicle detection sensor 260 may be located on the upper center portion of the front surface 210F of the frame and may detect a position (direction and distance) of another transport vehicle 20 located in front of the vehicle detection sensor 260. The vehicle detection sensor 260 may be configured as Lidar, radar, or a camera, etc.

Meanwhile, a bumper unit 270 for decreasing impact during collision of a transport vehicle with another transport vehicle 20 may be provided on each of the front surface 210F and rear surface 210R of the upper end portion of the hoist unit 200. The bumper unit 270 may include a front bumper unit 270F provided on the front surface 210F of the frame, and a rear bumper unit 270R provided on the rear surface 210R of the frame. In addition, a rear surface 210R of the frame 210 is provided with a pair of tail plates 280. The configuration of the bumper unit 270 and each of the tail plates 280 will be described with reference to FIGS. 4 to 7.

Figure 4:
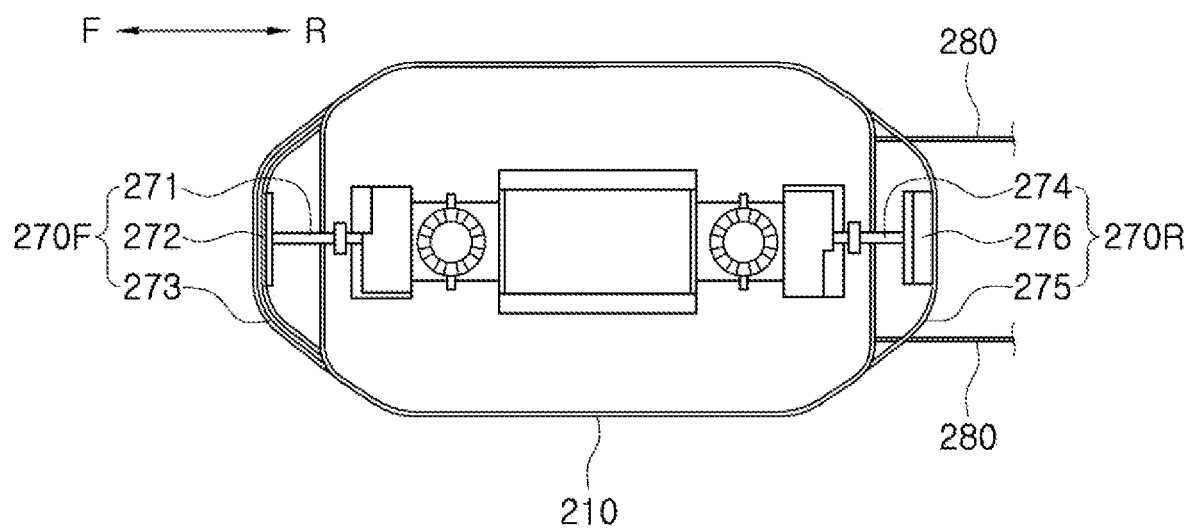
FIG. 4 illustrates the transport vehicle viewed from an upper side thereof.

FIG. 4 illustrates the transport vehicle viewed from an upper side thereof. Referring to FIG. 4, the frame 210 is formed to be long in a front-to-rear direction, and the front bumper unit 270F and the rear bumper unit 270R are provided respectively on the front and rear of the frame 210. That is, the bumper unit 270 may include the front bumper unit 270F provided on the front surface 210F of the frame 210, and the rear bumper unit 270R provided on the rear surface 210R of the frame 210.

The front bumper unit 270F may include: a front bracket 271 which is coupled to the center portion of the front surface of the frame 210 and has a shaft protruding forward; a front cover plate 272 which is coupled to opposite side portions of the front surface of the frame 210 and protrudes forward in an F direction and bends; and a rubber bumper member 273 coupled to an outer side of the front cover plate 272.

The rear bumper unit 270R may include: a rear bracket 274 which is coupled to the center portion of the rear surface of the frame 210 and has a shaft protruding rearward; a rear cover plate 275 which is coupled to the opposite side portions of the rear surface of the frame 210 and protrudes rearward in an R direction and bends; and a damper member 276 which is provided between the rear bracket 274 and the rear cover plate 275 and generates buffering force.

Figure 5:
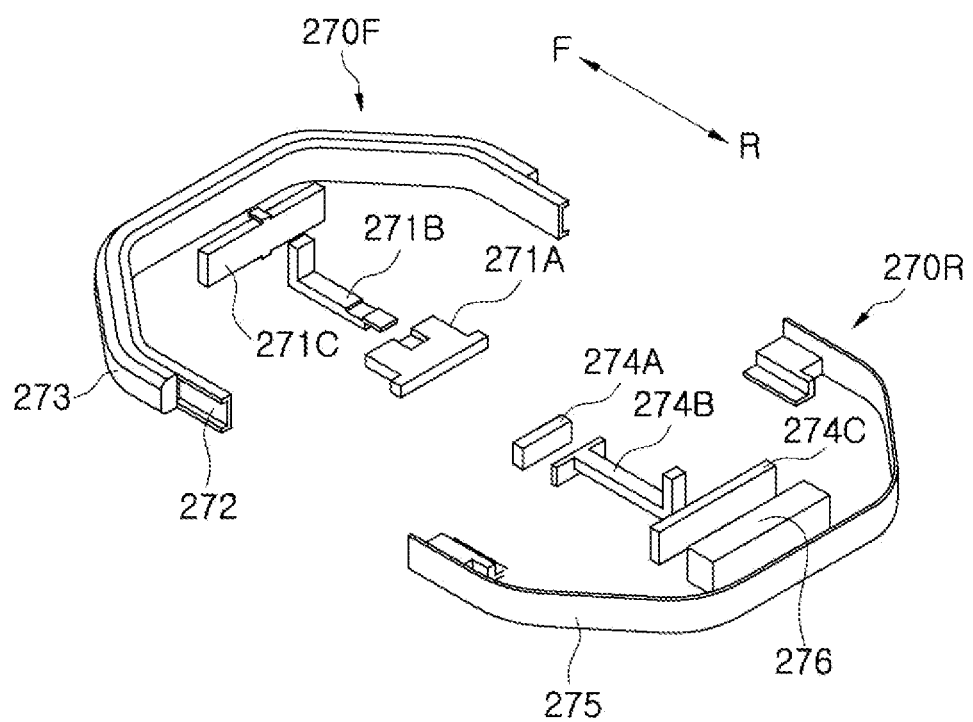
FIG. 5 illustrates the configuration of a bumper unit in the transport vehicle.

A state before the front bumper unit 270F and the rear bumper unit 270R are mounted to the frame 210 is illustrated in FIG. 5. The front bracket 271 includes a bracket 271A which couples the center portion of the front surface of the frame 210 and a bracket shaft 271B to each other; the bracket shaft 271B extending forward in the F direction; and a bracket 271C which couples the bracket shaft 271B and the front cover plate 272 to each other. The front cover plate 272 is coupled to the opposite sides of the frame 210 and is fixed to even the center portion of the front surface of the frame 210 through the front bracket 271. The rubber bumper member 273 may be mounted to the outer side of the front cover plate 272.

The rear bracket 274 includes: a bracket 274A which couples the center portion of the rear surface of the frame 210 and a bracket shaft 274B to each other; the bracket shaft 274B extending toward the rear side R; and a bracket 274C which couples the bracket shaft 274B and the rear cover plate 275 to each other. The rear cover plate 275 is coupled to the opposite sides of the frame 210 and is fixed to even the center portion of the rear surface of the frame 210 through the rear bracket 274. The damper member 276 for generating buffering force may be inserted to a position between the rear bracket 274 and the rear cover plate 275.

According to the present disclosure, the bumper unit 270 may be formed to protrude more than each of the opposite ends 100E of the driving unit 100. For example, referring to FIG. 6, the rear cover plate 275 of the rear bumper unit 270R may be formed by protruding rearward more than the rear end 100E of the body 110 of the driving unit 100. Similarly, even in the front surface of the transport vehicle 20, the front bumper unit 270F may be formed by protruding forward more than the front end of the driving unit 100. Since the bumper unit 270 is formed by protruding more than each of the opposite ends 100E of the driving unit 100, the driving unit 100 can be prevented from being damaged despite the collision of the transport vehicle 20 with another transport vehicle 20.

Meanwhile, the rear surface 210R of the frame 210 may be provided with the pair of tail plates 280. Each of the tail plates 280 may function as a reflector to be detected by another transport vehicle 20. When the tail plate 280 is installed on the center portion of the rear surface 210R of the frame 210, the vehicle detection sensor 260 located on the front of a rear transport vehicle 20 may be damaged by the tail plate 280 of a front transport vehicle 20 when the transport vehicles 20 collide with each other. The vehicle detection sensor 260 is a part that is usually expensive and difficult to obtain, and thus when the vehicle detection sensor 260 is damaged, the transport vehicle 20 may not be used for a long time, which is fatal. Accordingly, it is important to prevent damage to the vehicle detection sensor 260 even when transport vehicles 20 collide with each other. Accordingly, the tail plate 280 according to the embodiment of the present disclosure may include the pair of tail plates provided at opposite sides of the rear surface 210R of the frame 210 so as not to be in contact with the vehicle detection sensor 260 of the transport vehicle 20 located at the rear side.

Figure 6:
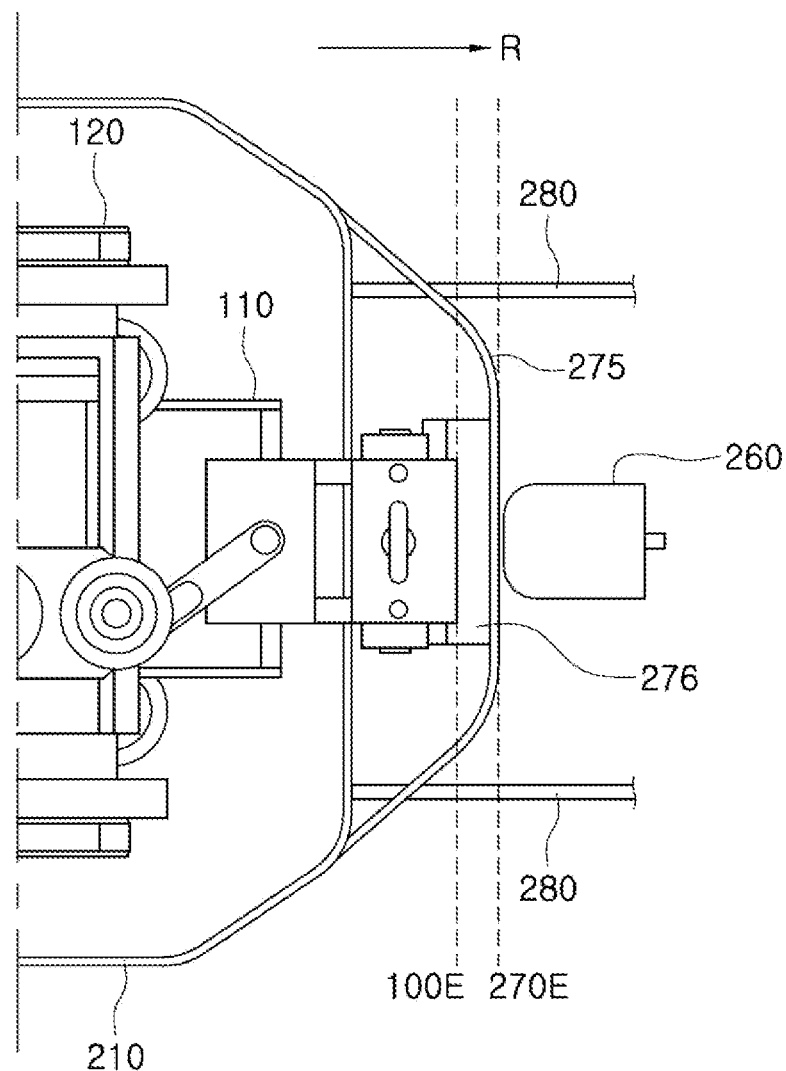
FIGS. 6 and 7 are diagrams illustrating a tail plate in the transport vehicle.
Figure 7:
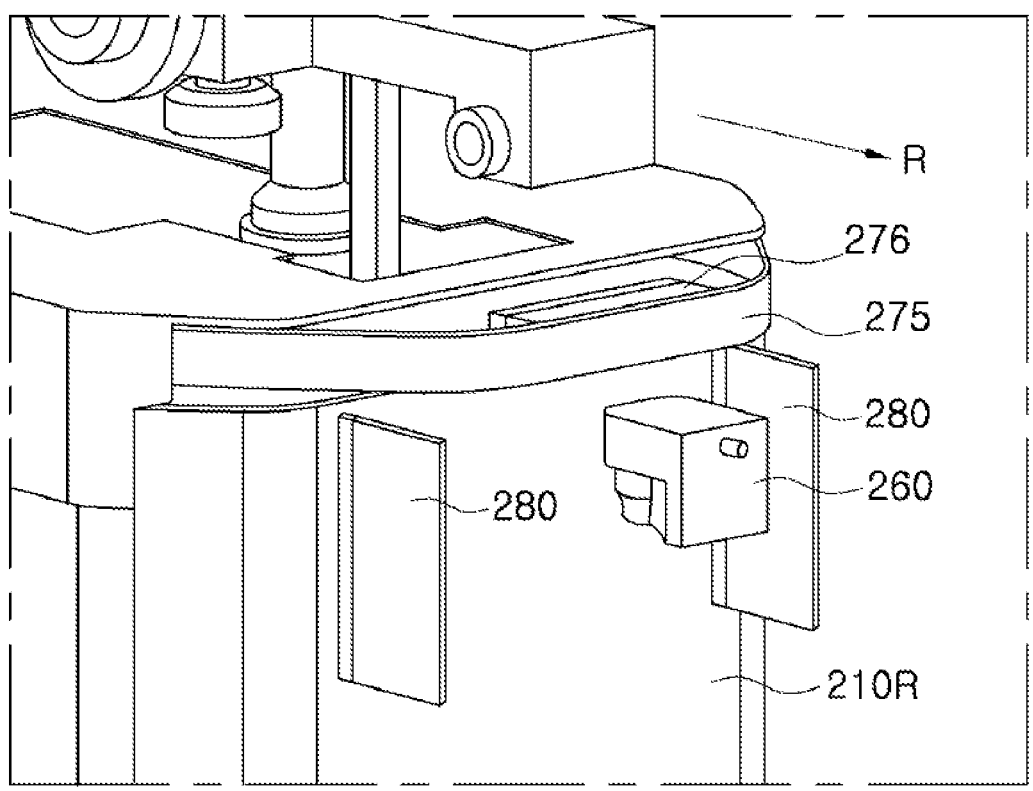

Referring to FIGS. 6 and 7, the tail plates 280 may be provided under the bumper unit 270. The tail plates 280 of a front transport vehicle may be provided so as not to interfere with opposite sides of the vehicle detection sensor 260 located on the front surface of a rear transport vehicle 20. The position of each of the tail plates 280 may be determined such that the tail plate 280 avoids colliding with the vehicle detection sensor 260 provided on the center portion of the front surface of the rear transport vehicle 20 during the collision of the front transport vehicle with the rear transport vehicle 20. The tail plate 280 is configured to reflect light emitted from the vehicle detection sensor 260.

The tail plate 280 may protrude rearward as much as an end 270E of the bumper unit 270. The tail plate 280 may be configured to protrude rearward as much as the end 270E of the bumper unit 270 such that the tail plate 280 is not damaged even in the event of collision between the transport vehicles 20.

This embodiment and the accompanying drawings of this specification clearly represent only some of the technical ideas included in the present disclosure, and it will be apparent that all modifications and specific embodiments that can be easily inferred by those skilled in the art within the scope of the technical idea included in the specification and drawings of the present disclosure are included in the scope of rights of the present disclosure.

Accordingly, the spirit of the present disclosure should not be limited to the described embodiment, and not only the claims to be described later, but also all that are equivalent or modified to be equivalent to the scope of the claims fall within the scope of the present disclosure.

What is claimed is:

1. A transport vehicle for transporting an article in a manufacturing factory, the transport vehicle comprising:
a driving unit which drives the transport vehicle along a driving rail; and
a hoist unit which is located under the driving unit and supports the article,
wherein the hoist unit comprises:
a frame; and
a pair of tail plates which is provided on a rear surface of the frame and extends away from the rear surface of the frame, and
wherein each tail plate of the pair of tail plates is positioned such that the pair of tail plates avoids colliding with a vehicle detection sensor provided on a center portion of a front surface of another transport vehicle during collision of the transport vehicle with another transport vehicle located behind the transport vehicle.

2. The transport vehicle of claim 1, further comprising:
a bumper unit provided on a rear of the frame,
wherein each tail plate of the pair of tail plates is provided under the bumper unit.

3. The transport vehicle of claim 2,
wherein the pair of tail plates extends to an end of the bumper unit.

4. The transport vehicle of claim 1,
wherein each tail plate of the pair of tail plates is configured to reflect light emitted from the vehicle detection sensor.

5. A transport vehicle for transporting an article in a manufacturing factory, the transport vehicle comprising:
a driving unit which drives the transport vehicle along a driving rail; and
a hoist unit which is located under the driving unit and supports the article,
wherein the hoist unit comprises:
a frame;
a bumper unit provided on each of a front surface of the frame and a rear surface of the frame; and
a pair of tail plates which is provided on the rear surface of the frame and extends away from the rear surface of the frame, and
wherein each tail plate of the pair of tail plates is positioned such that the pair of tail plates avoids colliding with a vehicle detection sensor provided on a center portion of a front surface of another transport vehicle during collision of the transport vehicle with another transport vehicle located behind the transport vehicle.

6. The transport vehicle of claim 5,
wherein the bumper unit comprises:
a front bumper unit provided on the front surface of the frame; and
a rear bumper unit provided on the rear surface of the frame.

7. The transport vehicle of claim 6,
wherein the front bumper unit comprises:
a front bracket which is coupled to a center portion of the front surface of the frame and has a shaft protruding forward;
a front cover plate which is coupled to opposite side portions of the front surface of the frame and protrudes forward and bends; and
a rubber bumper member coupled to an outer side of the front cover plate.

8. The transport vehicle of claim 6,
wherein the rear bumper unit comprises:
a rear bracket which is coupled to a center portion of the rear surface of the frame and has a shaft protruding rearward;
a rear cover plate which is coupled to opposite side portions of the rear surface of the frame and protrudes rearward and bends; and
a damper member which is provided between the rear bracket and the rear cover plate and generates buffering force.

9. The transport vehicle of claim 5,
wherein the bumper unit is formed to extend beyond each of opposite ends of the driving unit.

10. The transport vehicle of claim 5,
wherein in the frame, each tail plate of the pair of tail plates is provided under the bumper unit.

11. The transport vehicle of claim 10,
wherein the pair of tail plates extends to an end of the bumper unit.

12. The transport vehicle of claim 5,
wherein each tail plate of the pair of tail plates is configured to reflect light emitted from the vehicle detection sensor.

13. An article transport system of a manufacturing factory, the article transport system comprising:
a transport vehicle which transports an article; and
a driving rail which provides a driving path of the transport vehicle,
wherein the transport vehicle comprises:
a driving unit which drives the transport vehicle along the driving rail; and
a hoist unit which is located under the driving unit and supports the article,
wherein the hoist unit comprises:
a frame;
a bumper unit provided on each of a front surface of the frame and a rear surfaces of the frame; and
a pair of tail plates which is provided on the rear surface of the frame and extends away from the rear surface of the frame, and
wherein a position of each tail plate of the pair of tail plates is determined such that the pair of tail plates avoids colliding with a vehicle detection sensor provided on a center portion of a front surface of another transport vehicle during collision of the transport vehicle with another transport vehicle located behind the transport vehicle.

14. The article transport system of claim 13,
wherein the bumper unit comprises:
a front bumper unit provided on the front surface of the frame; and
a rear bumper unit provided on the rear surface of the frame.

15. The article transport system of claim 14,
wherein the front bumper unit comprises:
a front bracket which is coupled to a center portion of the front surface of the frame and has a shaft protruding forward;
a front cover plate which is coupled to opposite side portions of the front surface of the frame and protrudes forward and bends; and
a rubber bumper member coupled to an outer side of the front cover plate.

16. The article transport system of claim 14,
wherein the rear bumper unit comprises:
a rear bracket which is coupled to a center portion of the rear surface of the frame and has a shaft protruding rearward;
a rear cover plate which is coupled to opposite side portions of the rear surface of the frame and protrudes rearward and bends; and
a damper member which is provided between the rear bracket and the rear cover plate and generates buffering force.

17. The article transport system of claim 13,
wherein in the frame, each tail plate of the pair of tail plates is provided under the bumper unit.

* * * * *